United States Patent
Lee et al.

(10) Patent No.: US 12,211,835 B2
(45) Date of Patent: Jan. 28, 2025

(54) GROUP III-V IC WITH DIFFERENT SHEET RESISTANCE 2-DEG RESISTORS

(71) Applicant: Texas Instruments Incorporated, Dallas, TX (US)

(72) Inventors: Dong Seup Lee, Mckinney, TX (US); Hiroyuki Tomomatsu, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 335 days.

(21) Appl. No.: 17/462,743

(22) Filed: Aug. 31, 2021

(65) Prior Publication Data

US 2023/0065509 A1 Mar. 2, 2023

(51) Int. Cl.
| | |
|---|---|
| H01L 29/778 | (2006.01) |
| H01L 27/06 | (2006.01) |
| H01L 29/66 | (2006.01) |
| H01L 49/02 | (2006.01) |

(52) U.S. Cl.
CPC .......... *H01L 27/0629* (2013.01); *H01L 28/20* (2013.01); *H01L 29/66462* (2013.01); *H01L 29/778* (2013.01)

(58) Field of Classification Search
CPC .......... H01L 27/0802; H01L 28/20–26; H01L 29/66431; H01L 29/66462; H01L 29/778–7789
See application file for complete search history.

(56) References Cited

U.S. PATENT DOCUMENTS

| | | | | |
|---|---|---|---|---|
| 5,872,381 | A | * | 2/1999 | Kato ........................ H01L 21/84 257/E27.047 |
| 10,985,269 | B2 | | 4/2021 | Bramanti et al. |
| 2014/0091311 | A1 | * | 4/2014 | Jeon ........................ H01L 29/94 257/76 |
| 2017/0025406 | A1 | * | 1/2017 | Liao ..................... H01L 27/0605 |
| 2017/0207297 | A1 | * | 7/2017 | Gajda ................... H01L 27/0629 |
| 2019/0229203 | A1 | * | 7/2019 | Iucolano ............... H01L 29/778 |
| 2019/0267482 | A1 | * | 8/2019 | Udrea ................... H01L 29/778 |
| 2019/0348411 | A1 | * | 11/2019 | Chen ..................... H01L 29/7787 |
| 2022/0149037 | A1 | * | 5/2022 | Roig-Guitart ....... H01L 29/1066 |
| 2022/0406927 | A1 | * | 12/2022 | Park ..................... H01L 29/0642 |

* cited by examiner

*Primary Examiner* — Eric A. Ward
(74) *Attorney, Agent, or Firm* — Andrew R. Ralston; Frank D. Cimino

(57) ABSTRACT

An integrated circuit (IC) includes a lower group III-N layer having a first composition over a substrate, and an upper group III-N layer having a different second composition over the lower group III-N layer. A gate electrode of a High Electron Mobility Transistor (HEMT) is located over the upper group III-N layer. First and second resistor contacts make a conductive connection to the lower group III-N layer. An unbiased group III-N cover layer is located on the upper group III-N layer in a resistor area including a high Rs 2-DEG resistor, where the unbiased group III-N cover layer is positioned between the first and second contacts.

19 Claims, 13 Drawing Sheets

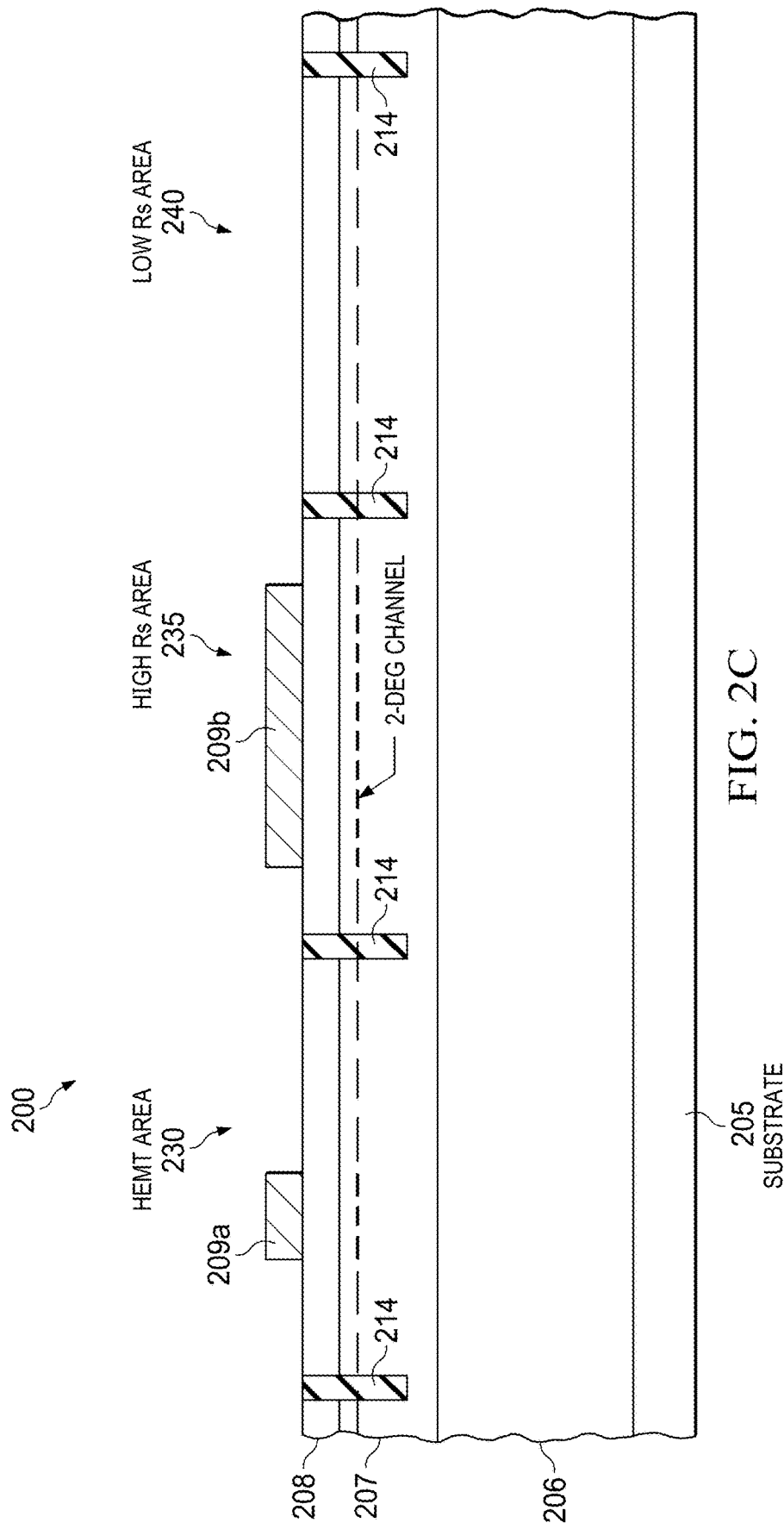

GROUP III-V IC WITH DIFFERENT SHEET RESISTANCE 2-DEG RESISTORS

FIELD

This Disclosure relates to semiconductor devices, and more particularly, but not exclusively, to Group III-N High Electron Mobility Transistors (HEMTs) and integrated circuits (ICs) therefrom that include two-dimensional electron gas (2 DEG) resistors.

BACKGROUND

Gallium Nitride (GaN), which is a group material, has increasingly been considered as a promising semiconductor material for use in power devices with the potential for increased power density, reduced ON-state resistance, and high frequency response. The relatively wide bandgap (Eg) of the GaN material (Eg=3.39 eV at room temperature) results in a high critical electric field (Ec=3.3 MV/cm) which can lead to GaN transistors with a shorter length drift region, and therefore lower ON-state resistance, when compared to a silicon-based metal oxide semiconductor (MOS) transistor with the same breakdown voltage. Besides GaN-based HEMTs, the HEMTs can also be based on other III-N substrate materials, such as AlGaN, AlN, and InAlGaN.

In the case of GaN HEMTs, the use of an AlGaN/GaN heterostructure also allows the formation of a 2-DEG layer at the AlGaN/GaN hetero-interface, where carriers can reach very high mobility ($\mu$=2,000 cm$^2$/(Vs)) values. In addition, the piezopolarization charge present at the AlGaN/GaN heterostructure results in a high electron density in the 2-DEG layer (e.g., 1×10$^{13}$ cm$^{-2}$). These properties allow HEMTs and Schottky barrier diodes with good performance parameters, including a high switching speed.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects recognize III-N IC devices, such as GaN-based IC devices, including a topside group III-V material layer (which may be termed a cover layer) such as p-type GaN, on a barrier layer such as AlGaN, is typically on a GaN layer integrated with multiple different circuit elements. Example circuit elements include a high-voltage (HV) HEMT, a low-voltage (LV) HEMT, a capacitor, and a resistor. In an enhancement-mode GaN-based process, the resistors may be 2-DEG resistors fabricated with a 2-DEG channel by the patterned etching of a topside group III-N material, such as p-type GaN, that is the same layer used on the HEMT gate stack above the barrier layer. In a HEMT, the topside III-V layer may be patterned generally with a photoresist pattern, and then the topside III-V layer may be etched for gate electrode formation. For a typical 2-DEG resistor process, a blanket etch may be used to remove all the topside III-V layer above the 2-DEG resistors to expose the barrier layer, such as an AlGaN barrier layer.

Due to the topside group III-V layer etching process, the uniformity of the 2-DEG resistor's resistance on the III-N IC is recognized herein to be affected by not only the epitaxial (epi) growth of the barrier layer including the thickness of the barrier layer, and also by the doping (e.g., Al) composition concentration of the topside group III-V layer, as well as the topside group III-V layer etch process. For example, overetch conditions when etching the topside group III-V layer can also degrade the uniformity of the 2-DEG sheet resistance (Rs) of the 2-DEG resistors across the IC, where the overetch can also result in the unwanted etching of the barrier layer underneath resulting in its thinning which raises the 2-DEG's Rs. Because each 2-DEG resistor on the same IC (and all the group III-N IC die on the wafer) experiences essentially the same processing, only a single nominal Rs value for the 2-DEG resistors on the IC die is possible using 2-DEG resistor formation processes consistent with this baseline.

Disclosed aspects include an IC that includes a lower group III-N layer having a first composition over a substrate, and an upper group III-N layer having a different second composition over the lower group III-N layer. A gate electrode of a HEMT is located over the upper group III-N layer. First and second resistor contacts make a conductive connection to the lower group III-N layer. An unbiased group III-N cover layer is located on the upper group III-N layer in a resistor area including a high Rs 2-DEG resistor, where the unbiased group III-N cover layer is positioned between the first and second resistor contacts.

BRIEF DESCRIPTION OF THE DRAWINGS

Reference will now be made to the accompanying drawings, which are not necessarily drawn to scale, wherein:

FIGS. 2A-2G are cross-sectional diagrams showing processing progression for an example method of forming a group III-N-based IC including a group III-N depletion-mode HEMT and both a low Rs 2-DEG resistor and a high Rs 2-DEG resistor, according to an example aspect. FIG. 2A shows the results after epitaxial growth of a group III-N top layer (e.g., p-type GaN layer) on an upper group III-N layer (e.g., AlGaN) layer that is on a lower group III-N layer (e.g., GaN) on a buffer layer that is on a substrate. FIG. 2B shows the results after patterning and etching off the top p-type GaN layer in an area of the IC shown as a low Rs resistor area while protecting the top p-type GaN layer in a high Rs resistor area 235 and in the gate region within an HEMT area 230.

FIG. 2C shows the results after forming an isolation region between the high and low Rs resistor area and in the HEMT area. The isolation region formation process can comprise ion implantation or etching through the AlGaN layer to reach the GaN layer.

FIG. 2D shows the results after forming a dielectric layer. The dielectric layer can comprise silicon nitride, silicon oxide, or aluminum oxide, and can be deposited by a deposition process, such as a low-pressure chemical vapor deposition (LPCVD) process. FIG. 2E shows the results after a contact etch process that uses a contact pattern which selectively etches through the dielectric layer to form contact apertures for the source and the drain of the HEMT device, as well as for the. high and low 2-DEG resistors. FIG. 2F shows the results after the deposition of a contact metal that fills the respective apertures which results in an ohmic contact formation for source and drain terminals of the HEMT vice and also respective contacts for the high and low 2-DEG resistors. FIG. 2G shows the results after forming a patterned gate electrode for the HEMT device to complete the HEMT device.

DETAILED DESCRIPTION

Figure 1:
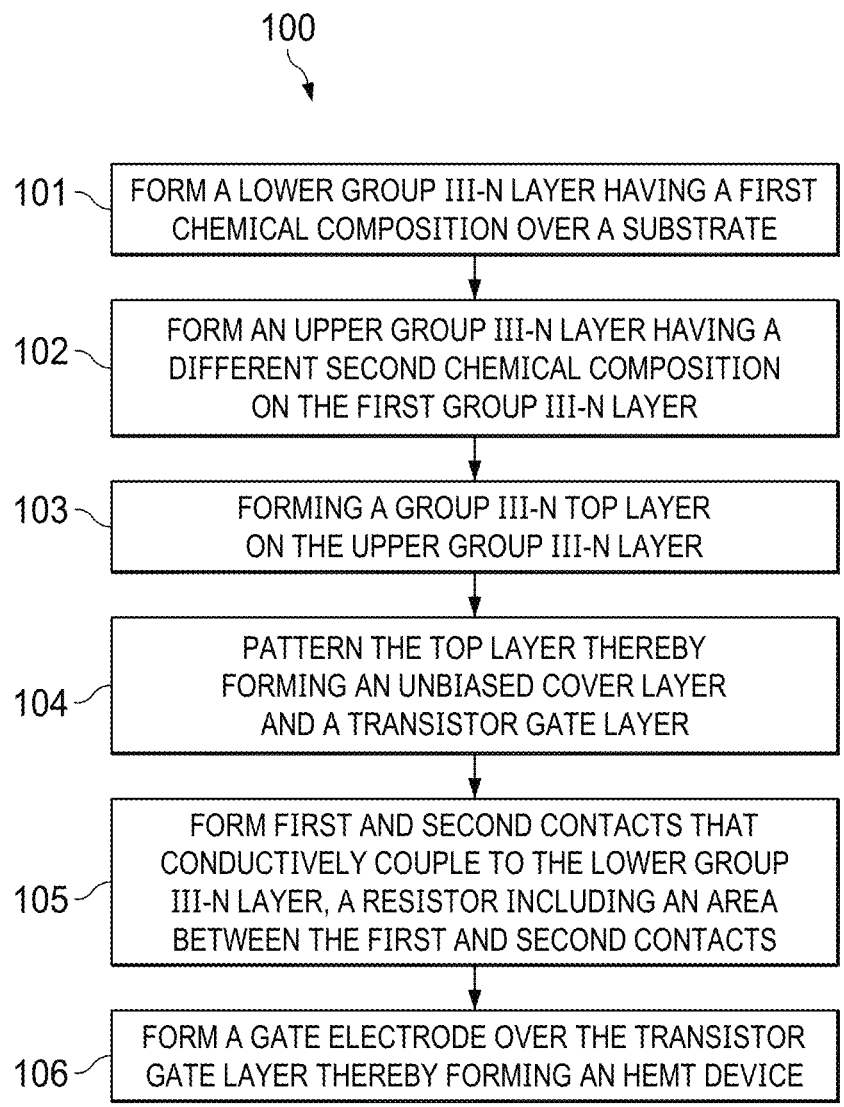
FIG. 1 is a flow chart that shows steps in an example method for forming a group III-N based IC including HEMTs and both a low Rs 2-DEG resistor and a high Rs 2-DEG resistor, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "connected to" or "connected with" (and the like) as used herein without further qualification are intended to describe either an indirect or direct electrical connection. Thus, if a first device "connects" to a second device, that connection can be through a direct electrical connection where there are only parasitics in the pathway, or through an indirect electrical connection via intervening items including other devices and connections. For indirect connecting, the intervening item generally does not modify the information of a signal Disclosed aspects can utilize an enhancement mode (E-mode) group III-N HEMT device process on a depletion mode (D-mode) epitaxial layer which is a lower Rs epitaxial layer. Even with a topside group III-V layer being p-type GaN on an epitaxial layer comprising AlGaN on undoped GaN, the channel of the HEMT device is recognized to generally not be fully depleted in a D-mode process.

Regarding the example of an AlGaN/GaN HEMT structure, a 2-DEG channel is formed in the GaN layer below the epitaxial AlGaN layer due to the polarization effect. Since the 2-DEG channel is already formed with the growth of the epitaxial AlGaN layer, HEMT devices built on AlGaN/GaN have a negative threshold voltage, whereas p-type GaN as the topside group III-V layer on the top of AlGaN/GaN HEMT structures can be used to make the threshold voltage more positive to provide either enhancement-mode HEMT devices or depletion-mode HEMT devices having a less negative threshold voltage because the p-type GaN on a AlGaN/GaN for a HEMT device depletes the 2-DEG channel by raising conduction band of the 2-DEG channel.

Disclosed aspects can be applied in one particular disclosed aspect when p-type GaN is utilized as the topside group III-V layer to make depletion-mode devices with less negative HEMT threshold voltages. In this case, the 2-DEG channel density with and without p-type GaN can be different. Disclosed aspects recognize that with p-type GaN on the AlGaN layer, this results in a lower 2-DEG channel density leading to a relatively high Rs resistance in the channel when no bias is applied to the p-type GaN. Absence of the p-type GaN (e.g., by etching off the p-type GaN) results in a higher 2-DEG channel density leading to a relatively low Rs resistor. Thus, two or more resistor types can be formed on the same substrate, one having a higher sheet resistance and another having a lower sheet resistance.

The availability of resistors with different sheet resistance provides a degree of freedom to a device designer that was unavailable previously.

Using disclosed aspects, 2-DEG resistors with different nominal Rs values can thus be fabricated on the same IC die without the need for any additional mask(s) level. Disclosed aspects enable fabrication of group III-N ICs including HEMTs and 2-DEG resistors with and without a p-GaN layer or other group III-N top layer to provide two different 2-DEG resistors having different nominal Rs values. One of the 2-DEG resistors comprises a high Rs resistor including a p-GaN top layer and another 2-DEG resistor comprises a low Rs resistor not having the p-GaN top layer coverage. The gate electrode material can comprise a variety of different materials such as copper, and nickel/gold.

The new relatively high Rs 2-DEG resistor disclosed herein comprises the topside group III-V material layer (e.g., p-GaN layer) which may be on top of an upper layer, e.g., an epitaxial layer, that may comprise AlGaN that is generally also under the gate electrode of the HEMT devices. There are a variety of different layer stack arrangements that may be used with disclosed aspects. For example, as described with respect to the topside group III-N layer comprising p-type GaN in some examples, the upper group III-N layer can comprise AlGaN, and the lower group III-N layer can comprise undoped GaN. In addition, other example layer stacks include the topside group III-N layer comprising p-type GaN or p-type AlGaN, the upper group III-N layer comprising AlGaN, InAlN or AlN, and the lower group III-N layer comprising undoped GaN.

Disclosed aspects can provide better 2-DEG resistor resistance uniformity on each semiconductor die because there is no topside group III-V layer (e.g., p-type GaN) etching step involved for forming the high Rs 2-DEG resistors. This aspect improves the 2-DEG resistance uniformity across the IC device, as well as an IC die area saving realized because to obtain the same resistance value, a smaller area is needed when a disclosed high Rs resistor is used.

FIG. 1 is a flow chart that shows steps in an example method 100 for forming a group III-N based depletion mode IC including at least one depletion mode HEMT, a high Rs 2-DEG resistor, and optionally a low Rs 2-DEG resistor, according to an example aspect. FIGS. 2A-2G are cross-sectional diagrams showing process progression for an example method of forming a group III-N-based IC 200 including group III-N HEMTs including both a low Rs 2-DEG resistor and a high Rs 2-DEG resistor, according to an example aspect.

Step 101 comprises forming a lower group III-N layer having a first chemical composition over a substrate. In some examples the first chemical composition is undoped GaN, which may be epitaxially grown over a substrate that includes a buffer layer. The lower group III-N layer may also be referred to as a channel layer. Step 102 comprises forming an upper group III-N layer having a different second chemical composition on the lower group III-N layer. In some examples the second chemical composition is undoped AlGaN. The upper group III-N layer may also be referred to as a barrier layer. Strain at the interface between the channel layer and the barrier layer results in a polarization-induced charge that forms the 2-DEG on the channel layer side of the interface. In step 103 a group III-N top layer is formed on the upper group III-N layer. The top layer may be referred to as a gate layer, and may have a different chemical composition than both the channel layer and the barrier layer. In one example the gate layer is p-doped GaN.

Figure 2A:
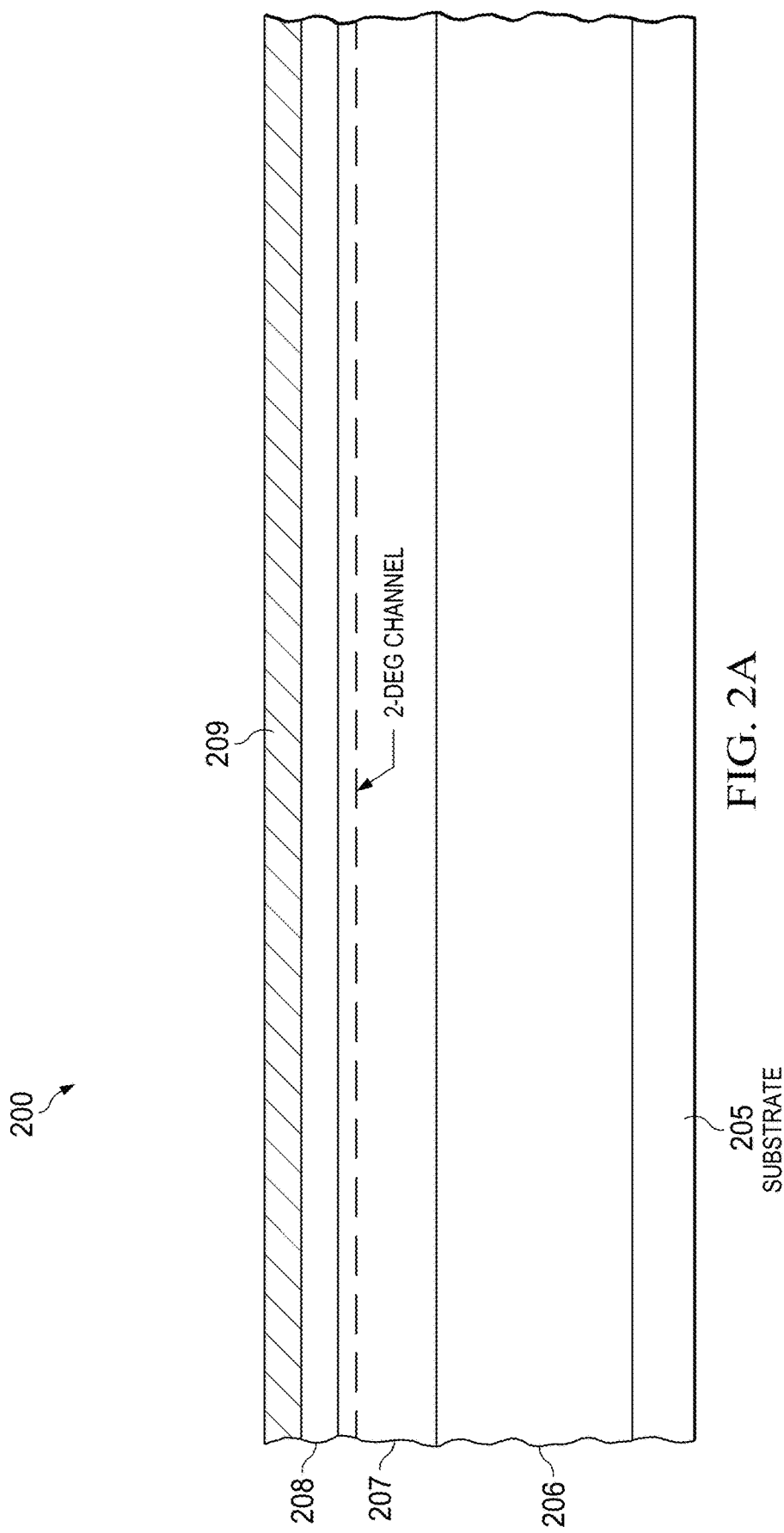

FIG. 2A is a cross-sectional view that depicts results for the partially-formed group III-N based IC 200 following step 103. There is shown a group III-N top layer 209 on an upper group III-N layer 208 and a lower group III-N layer 207 on buffer layer 206 over a substrate 205. The lower group III-N layer 207 may be equivalently referred to as channel layer 207, the upper group III-N layer 208 may be equivalently referred to as barrier layer 208, and the group III-N top layer 209 may be equivalently referred to as gate layer 209.

Various layer stacks can be used comprising the group III-N top layer 209, the upper group III-N layer 208 and the lower group III-N layer 207. For example, the group III-N top layer 209 can comprise p-type GaN, the upper group III-N layer 208 can comprise AlGaN, and the lower group III-N layer 207 can comprise undoped GaN. The group III-N top layer 209 can comprise p-type GaN or p-type AlGaN, the upper group III-N layer 208 can comprise AlGaN, InAlN or AlN, and the lower group III-N layer 207 can comprise undoped GaN.

The generally optional buffer layer 206 can for example comprise AlGaN with a range of different Al % compositions, or an AlN superlattice. The substrate 205 can comprise undoped GaN, sapphire, silicon (generally needing the buffer layer 206), silicon carbide, or alumina. The group III-N top layer 209 can also comprise undoped GaN. In this arrangement it is recognized that the 2-DEG depletion effect can be achieved with a sufficiently thick top undoped GaN layer, where a few tens of nm (such as at least 20 nm) should generally be enough for the depletion effect, such an undoped GaN layer on an AlGaN/GaN heterostructure.

Returning to FIG. 1, Step 104 comprises patterning (generally utilizing a mask level) then etching the group III-N top (gate) layer to protect the group III-N top layer in HEMT areas having at least one HEMT device and in first resistor areas, but not in second resistor areas.

Figure 2B:
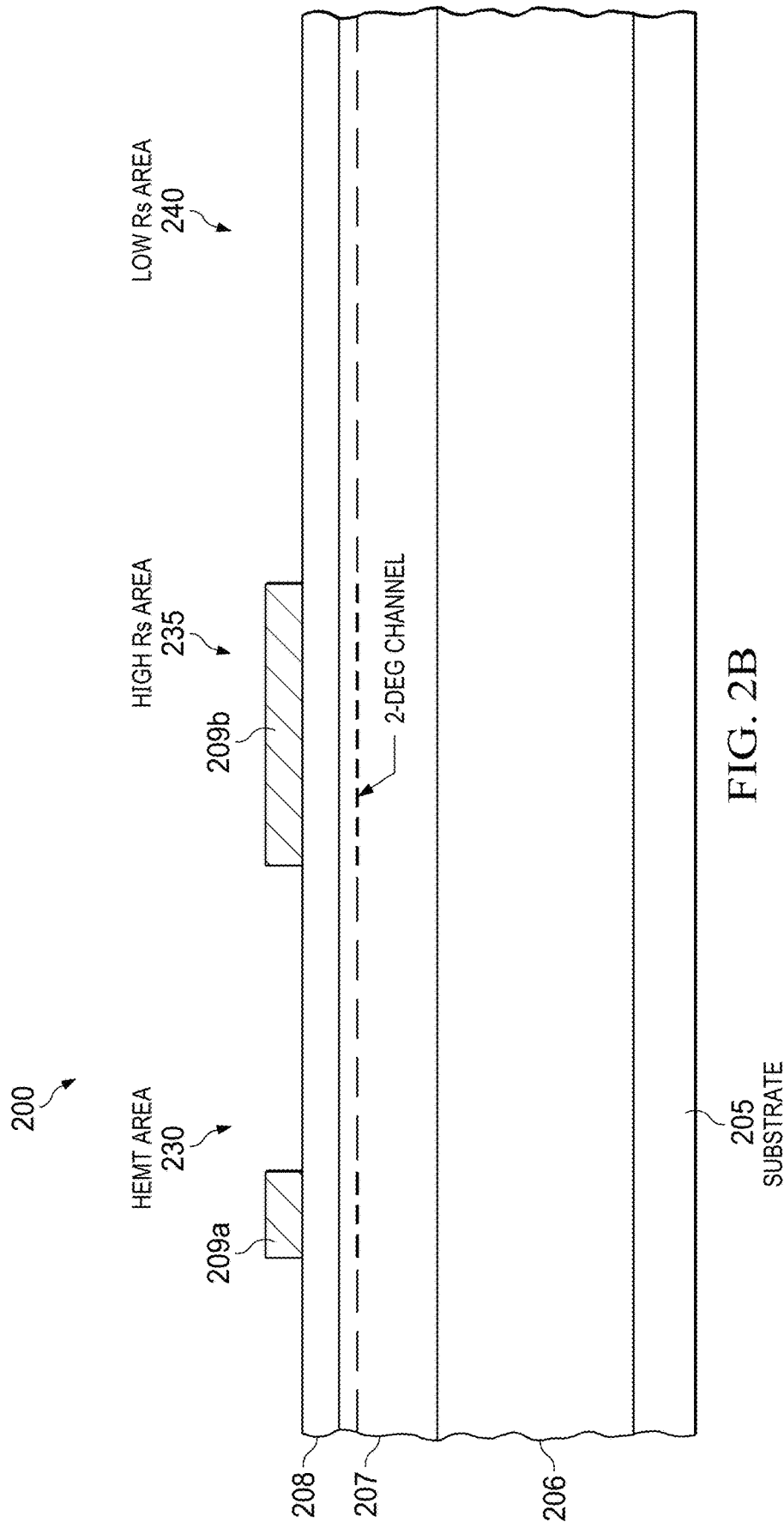

FIG. 2B is a cross-sectional view that depicts results for the group III-N based IC 200 following step 104. Three areas are shown, an HEMT area 230, a high-Rs area 235 and a low Rs area 240. There is a group III-N top layer portion 209a on the upper group III-N layer 208 in the HEMT area 230. A first resistor is to be formed in the high-Rs area 235, which includes a group III-N top layer portion 209b, and a second resistor is to be formed in the low-Rs area 240, in which the group III-N top layer 209 is completely removed. The area of the group III-N top layer portion 209a area may be, and is illustrated without implied limitation as being smaller as compared to the area of the top layer portion 209b. The 2-DEG, as represented by a dashed line, is partially depleted and thus has a lower electron concentration under the top layer portions 209a and 209b due to the proximity of the p-doped group III-N material.

Figure 2D:
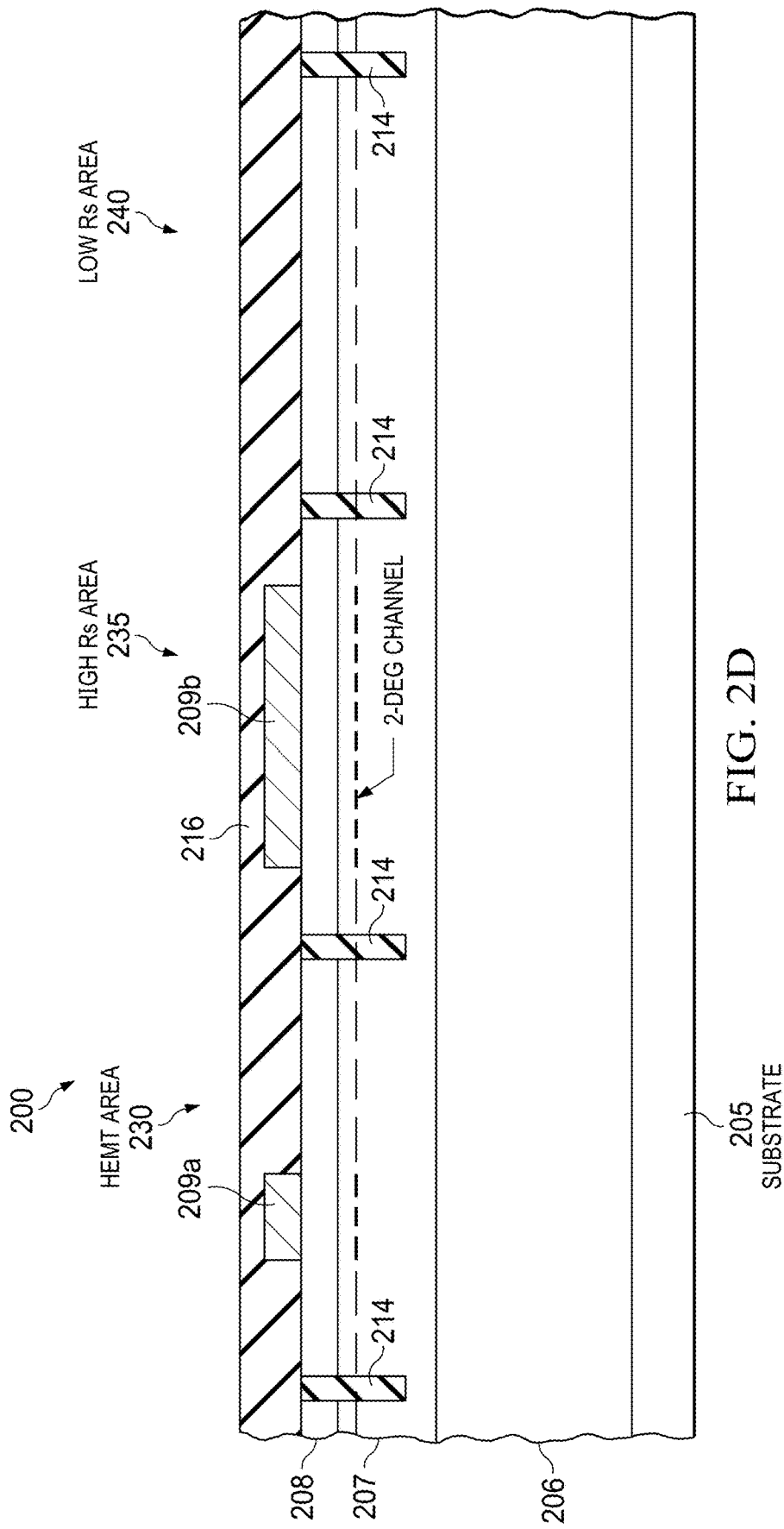

Following step 104 there can then be a step (not shown in FIG. 1) of forming isolation regions that can comprise isolation etching or ion implantation. FIG. 2C is a cross-sectional view that depicts results for the group III-N based IC 200 following forming the isolation region showing isolation regions as 214 between adjacent areas 230, 235 and 240. There can then be the step of dielectric layer deposition over the top layer portions 209a and 209b. The dielectric layer can comprise SiN, SiO, or AlO (described by general empirical formulae reflecting the possibility that some processes do not deposit such film with exact stoichiometric ratios). FIG. 2D is a cross-sectional view that depicts results for the group III-N based IC 200 following the forming of a dielectric layer 216 over the top layer portions 209a, 209b and the upper group III-N layer 208. While the dielectric layer 216 is shown having a planar top surface, in various examples the top surface of the dielectric layer 216 may reflect the underlying topography and thus be non-planar.

Figure 2E:
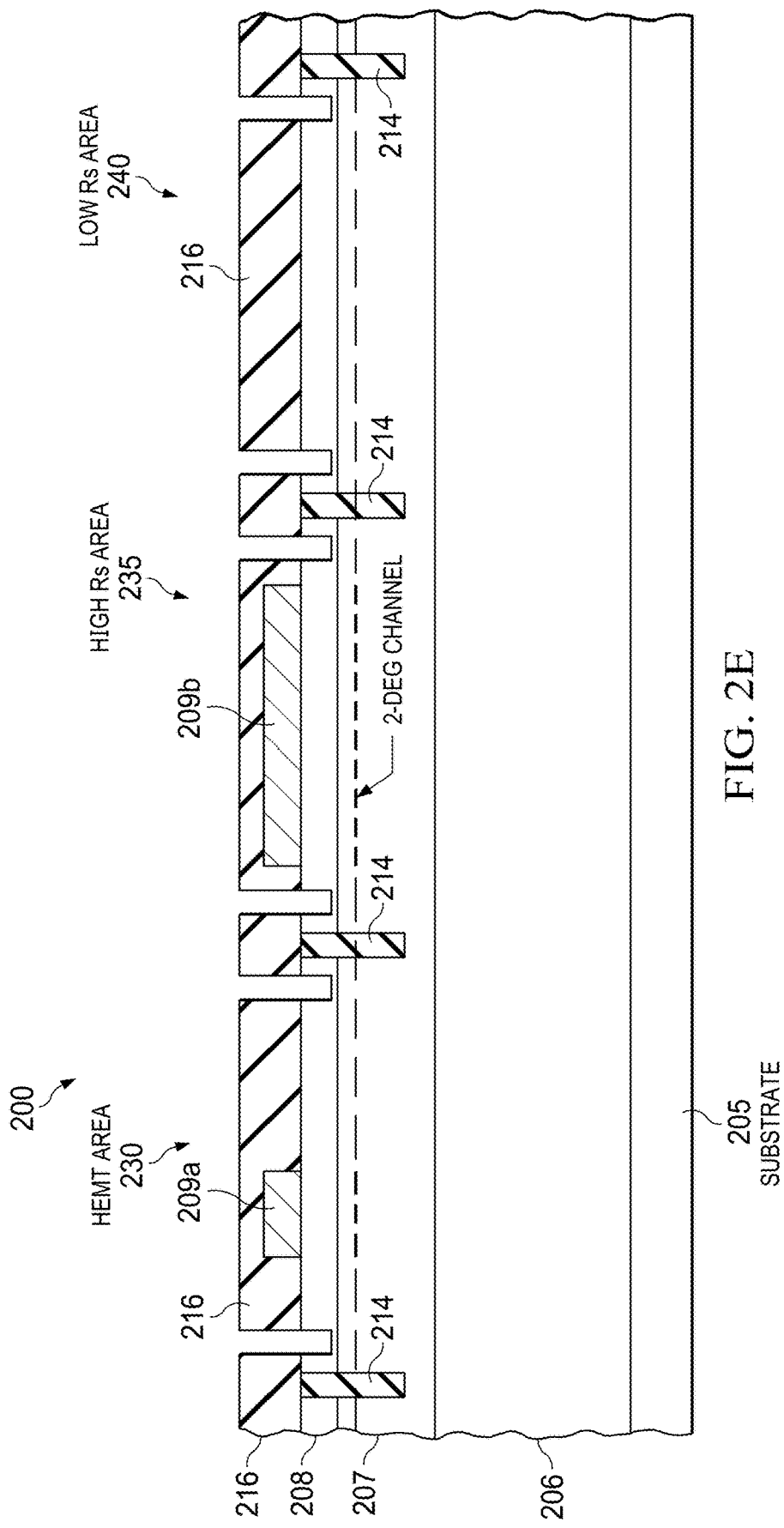

Referring again to FIG. 1, Step 105 comprises forming filled contacts in the upper group III-N layer 208 that extend toward the lower group III-N layer 207 and the 2-DEG. Forming the filled contacts may generally comprise etching contact openings followed by depositing contact metal into the openings. FIG. 2E is a cross-sectional view that depicts results for the group III-N based IC 200 following etching unreferenced contact openings. The openings are shown as stopping in the barrier layer 208 near the interface with the channel layer 207. In such examples conduction between the contacts and the 2-DEG may include tunneling across the remaining barrier layer 208. In other examples the openings end at or below the interface between the layer 207 and 208.

Figure 2F:
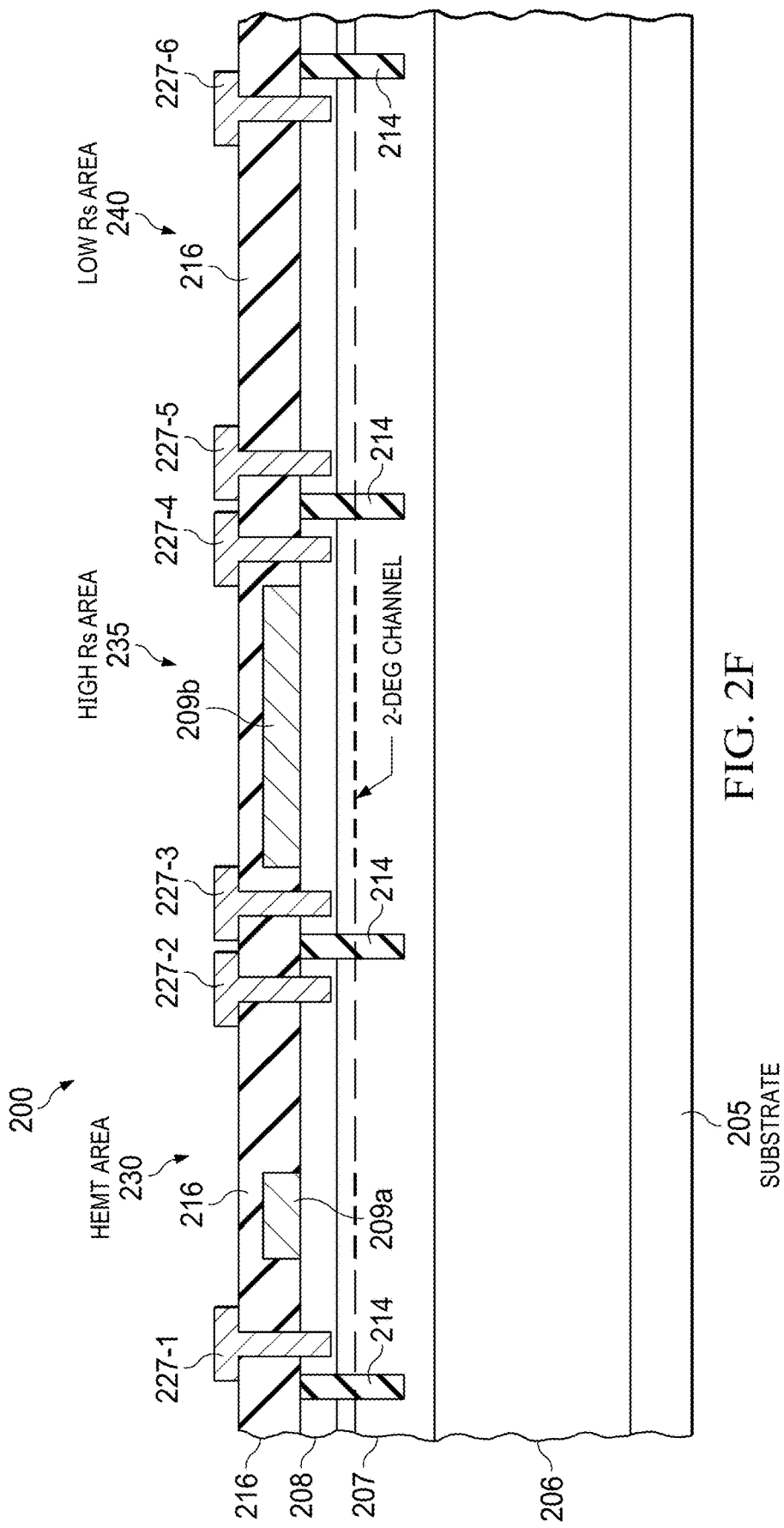

FIG. 2F is a cross-sectional view that depicts results for the group III-N based IC 200 following depositing contact metal into the openings to form metal contacts referred to collectively as contacts 227 that in various examples provide a conductive path to the 2-DEG. Contacts 227-1 and 227-2 provide connection terminals to an HEMT transistor located in the HEMT area 230. Contacts 227-3 and 227-4 provide connection terminals to a high Rs resistor located in the high Rs resistor area 235. Contacts 227-5 and 227-6 provide connection terminals to a low Rs resistor located in the low Rs area 240. The contact metal is not limited to any particular type, and can comprise one or more of a variety of different metals, such as Ti/Al/TiW/Ni/W/Au/Pt, depending on the specific parameters of the desired device or process. Each pair of contacts 227 may be said to define a lateral extent of a component of which that pair of contacts 227 are electrical terminals. Thus, the contacts 227-3 and 227-4 define the lateral extent of the high Rs resistor, and the contacts 227-5 and 227-6 define the lateral extent of the low Rs resistor.

Figure 2G:
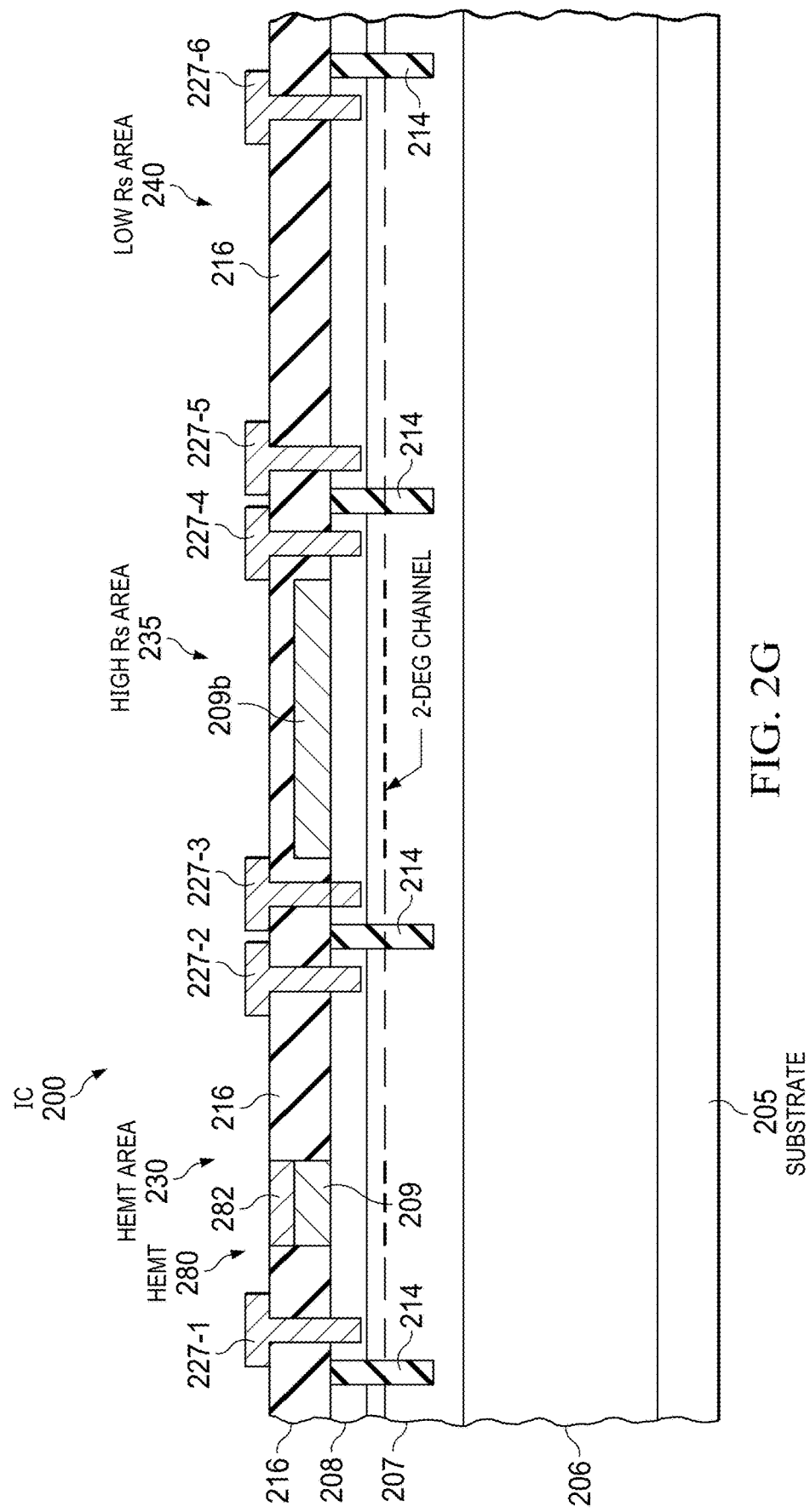

FIG. 2G is a cross-sectional view that depicts results for the group III-N based IC 200 following forming a gate electrode 282 to provide a HEMT device shown as 280. In the illustrated example the gate electrode 282 has a same lateral extent as the group III-N top layer portion 209a. In some other examples the gate electrode 282 has a lesser lateral extent as the portion 209a. In some such examples the gate electrode 282 is formed during the contact etch and fill steps described with respect to the contacts 227. In various examples the IC 200 includes circuitry comprising at least one HEMT device 280 in the HEMT area(s) 230, and a 2-DEG resistor in the first resistor area(s) 235, having relatively high sheet resistance. In some such examples the IC 200 also includes one or more instances of the second resistor area(s)s 240 having a sheet resistance that is relatively low sheet resistance as compared to the resistor(s) in the first resistor area(s) 235. The HEMT device 280 as described above can comprise a depletion mode device or an enhancement mode device. The IC 200 is configured for realizing at least one circuit function. The circuit function can comprise, for example, power conversion, signal amplification, or signal processing.

A sheet resistance ratio of the relatively high sheet resistance 2-DEG resistor in the high Rs area 235 to the relatively low sheet resistance 2-DEG resistor in the low Rs area 240 may be between 1.1 and 1,000. However, this ratio can be increased by 100-1000× depending on the heterostructure design. For example, the thickness of the epitaxial group III-N layer 208 (AlGaN barrier layer) can be changed, doping of epitaxial group III-N layer 208 can be changed, and the chemical composition can be changed (e.g., a change of Al concentration for an AlGaN barrier layer), as well as doping of the top layer 209 (p-GaN doping), or the Al concentration in the group III-N top layer 209.

The group III-N top layer 209 can also comprise undoped GaN. This arrangement is based on the recognition that the 2-DEG depletion effect can be achieved not only with p-type GaN as the group III-N top layer, but also that undoped GaN that has a sufficient thickness, typically a minimum thickness of a few tens of nm for the undoped GaN top layer, is generally enough for the depletion effect, such as on an AlGaN/GaN heterostructure.

The top layer portion 209b, also referred to as cover layer 209b is unbiased. As used herein and in the claims, an "unbiased cover layer" is a portion of the top layer 209 that is unconnected to any metal, is connected to metal that is otherwise unconnected to any bias source (thus electrically "floating"), or is connected to metal that is in turn connected to a grounded one of the connection terminals (e.g., a contact) of a resistor defined by the contact layer 209b.

Figure 3:
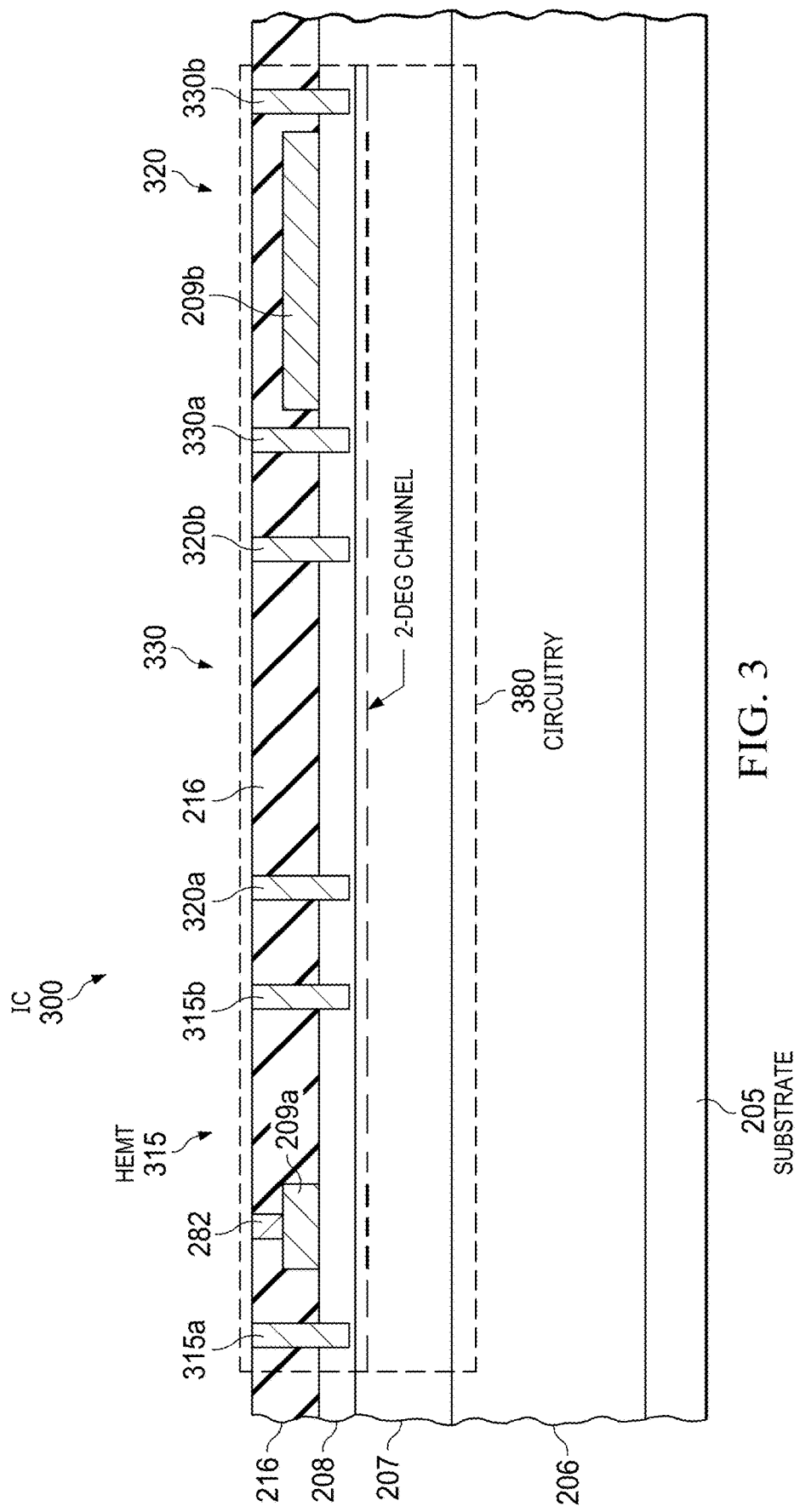
FIG. 3 is a cross sectional view of a group III-N based IC including a group III-N HEMT device largely corresponding to the HEMT device shown in FIG. 2G, and both a low Rs 2-DEG resistor and a high Rs 2-DEG resistor, according to an example aspect.
Figure 5A:
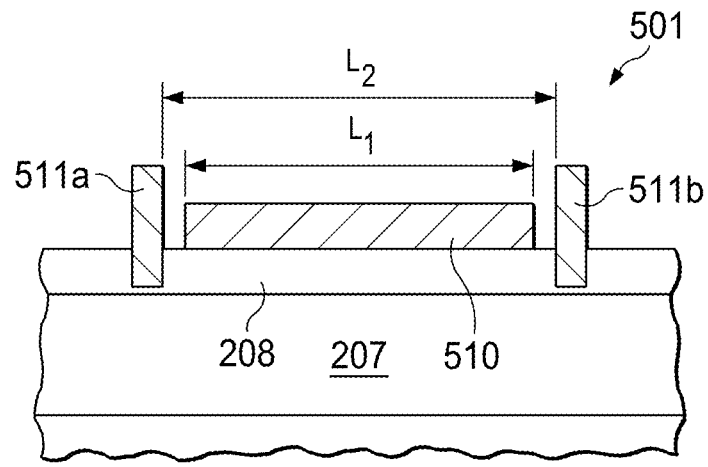
FIGS. 5A-5D show various examples of unbiased cover layers that may be used in example resistors.

FIGS. 5A-5D provide examples of various configurations of the unbiased cover layer. FIG. 5A illustrates a resistor 501 having an unbiased cover layer 510 that follows the configuration of the top layer portion 209b in that it is not connected to any metal, and extends between contacts 511a and 511b by a lateral distance $L_1$. The lateral distance between the contacts 511a and 511b is $L_2$. The lateral distance $L_1$ is at least 90% of $L_2$. This ratio is in marked contrast to the lateral extent of the group III-N top layer portion 209a between the contacts 315a and 315b as shown in FIG. 3. The portion 209a, which forms the gate layer of the HEMT 315, spans no more than 20% of the lateral distance between the contacts 315a and 315b. Such a limit may be necessitated by, e.g., the need to provide sufficient lateral distance between the portion 209a and the contacts 315a and 315b to accommodate a large voltage drop across the HEMT 315. The resistor 501 is not constrained by this requirement and thus the cover layer 510 preferably spans the maximum possible distance between the contacts 511a and 511b. The configuration illustrated by FIG. 5A provides that the contacts 511a and 511b do not traverse the cover layer 510. Thus, the etch process used to form the contacts 511a and 511b may the same etch process that forms contacts to various HEMTs on the same substrate. The minimum distance between the contacts 511a and 511b and the cover layer 510 may be determined by design rules that ensure consistent processing, without implied limitation being about 500 nm.

Figure 5B:
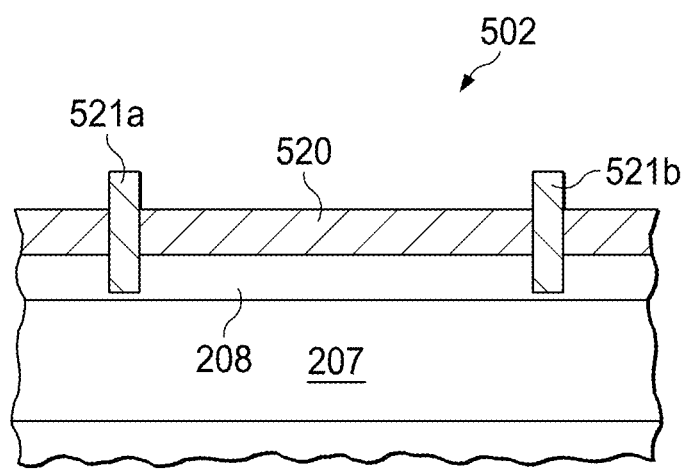

FIG. 5B illustrates an example resistor 502 in which contacts 521a and 521b extend through an unbiased cover layer 520. In this example the cover layer 520 extends 100% of the lateral distance between the contacts 521a and 521b. This configuration may benefit from the consistency of the sheet resistance between the contacts 521a and 521b, but may result in a more complex etch process, or multiple etch processes, to form the contacts 521a and 521b and other contacts that do not extend through a material layer such as the group III-N top layer 209.

Figure 5C:
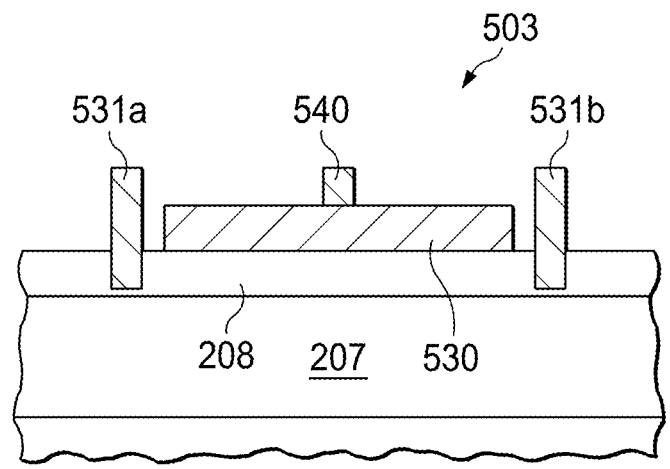

FIG. 5C illustrates an example resistor 503 that includes an unbiased cover layer 530 between contacts 531a and 531b. A metal electrode 540 contacting the cover layer 530 is unconnected to any bias source, e.g., is floating. Because the metal electrode 540 is unconnected to a bias source, the cover layer 530 is unable to operate as a transistor gate layer, but serves to partially deplete the 2-DEG in the channel layer 107.

Figure 5D:
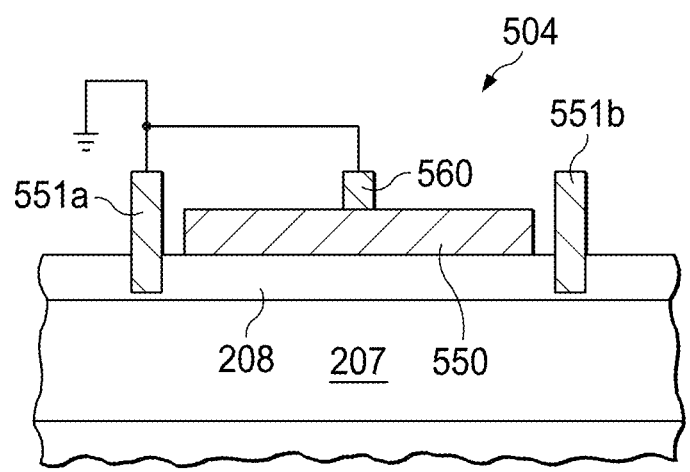

FIG. 5D illustrates an example resistor 504 that includes an unbiased cover layer 550 between contacts 551a and 551b. A metal electrode 560 contacting the cover layer 550 is connected to the contact 551a, which is grounded. In this example the unbiased cover layer 550 is held at ground, which is unbiased. The cover layer 550 is also unable to operate as a transistor gate layer, but serves to partially deplete the 2-DEG in the channel layer 107.

FIG. 3 is a cross sectional view of a group III-N-based IC 300 including a group III-N HEMT device 315 corresponding to the HEMT device 280 shown in FIG. 2G, a high Rs 2-DEG resistor 320, and in an optional low Rs 2-DEG resistor 330 according to an example aspect. For simplicity isolation regions analogous to the isolation regions 214 shown for IC 200 in FIG. 2G are omitted from the figure though may be present in the IC 300. The HEMT device 315 includes a source contact 315a, a drain contact 315b, the low Rs 2-DEG resistor 320 is shown including contacts 320a, 320b, and the high Rs 2-DEG resistor 330 is shown including contacts 330a, 330b.

These components and other electronic circuitry are shown within a block defined by dashed lines identified as circuitry 380. The circuitry 380 generally comprises circuit elements (including HEMTs, and generally diodes, resistors, capacitors, etc.) formed in the III-N material configured together for realizing at least one circuit function such as power conversion, signal amplification or signal processing.

Figure 6:
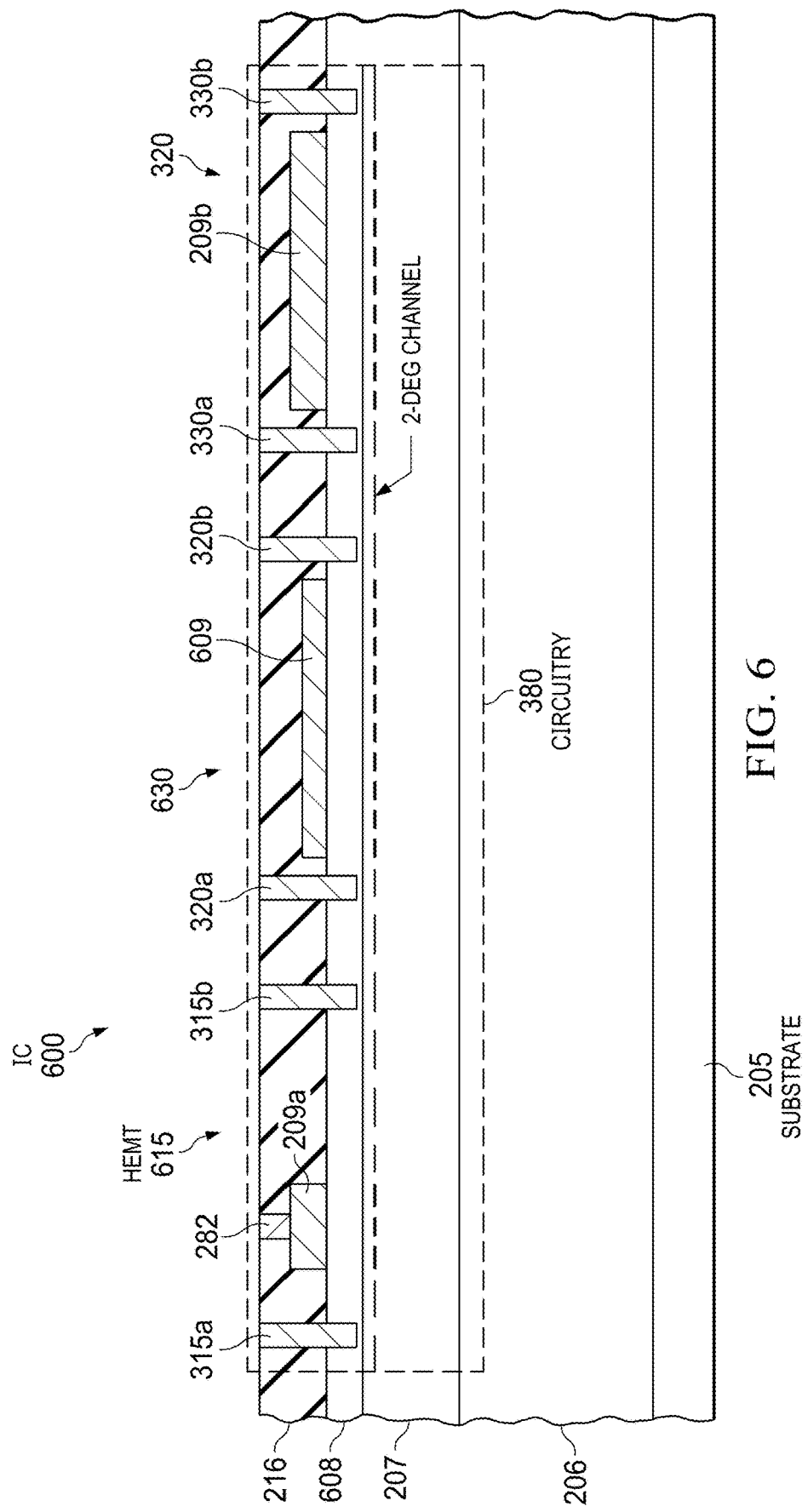
FIG. 6 illustrates an example implementation of a resistor and an enhancement-mode HEMT.

As described above the HEMT device can comprise an enhancement mode device or a depletion mode device. FIG. 6 illustrates an example IC 600 including an HEMT 615 that includes an epitaxial group III-N layer 608. The epitaxial group III-N layer 608 may differ from the epitaxial group III-N layer 208 by one or more of thickness or doping such that the 2-DEG is fully depleted below a group III-N top layer portion 609a. In addition to such possible changes to the thickness or doping of the epitaxial group III-N layer 608, other options may include 1) placing the gate metal 282 in direct contact with the epitaxial group III-N layer 608 (e.g., AlGaN layer) to provide a Schottky gate contact, and 2) placing the gate metal 282 in direct contact with a dielectric layer between the gate metal 282 and the epitaxial group III-N layer 608 to form a Metal-Insulator-Semiconductor (MIS) structure. Further, in some examples the thickness of the group III-N top layer may be reduced for the topside group III-V layer in the low Rs 2-DEG resistor, as illustrated in FIG. 6 for a low Rs 2-DEG resistor 630 having a topside group III-V layer 609 with a thickness less than the group III-N top layer portion 209b. This example provides a depletion of the 2-DEG channel that is between that of the HEMT 615 and the high Rs 2-DEG resistor 320 that provides conductivity through the resistor 630 while providing a normally-off channel in the HEMT 615. This example may require an additional mask level to implement the topside group III-V layer 609.

EXAMPLES

Disclosed aspects are further illustrated by the following specific Examples, which should not be construed as limiting the scope or content of this Disclosure in any way.

Figure 4:
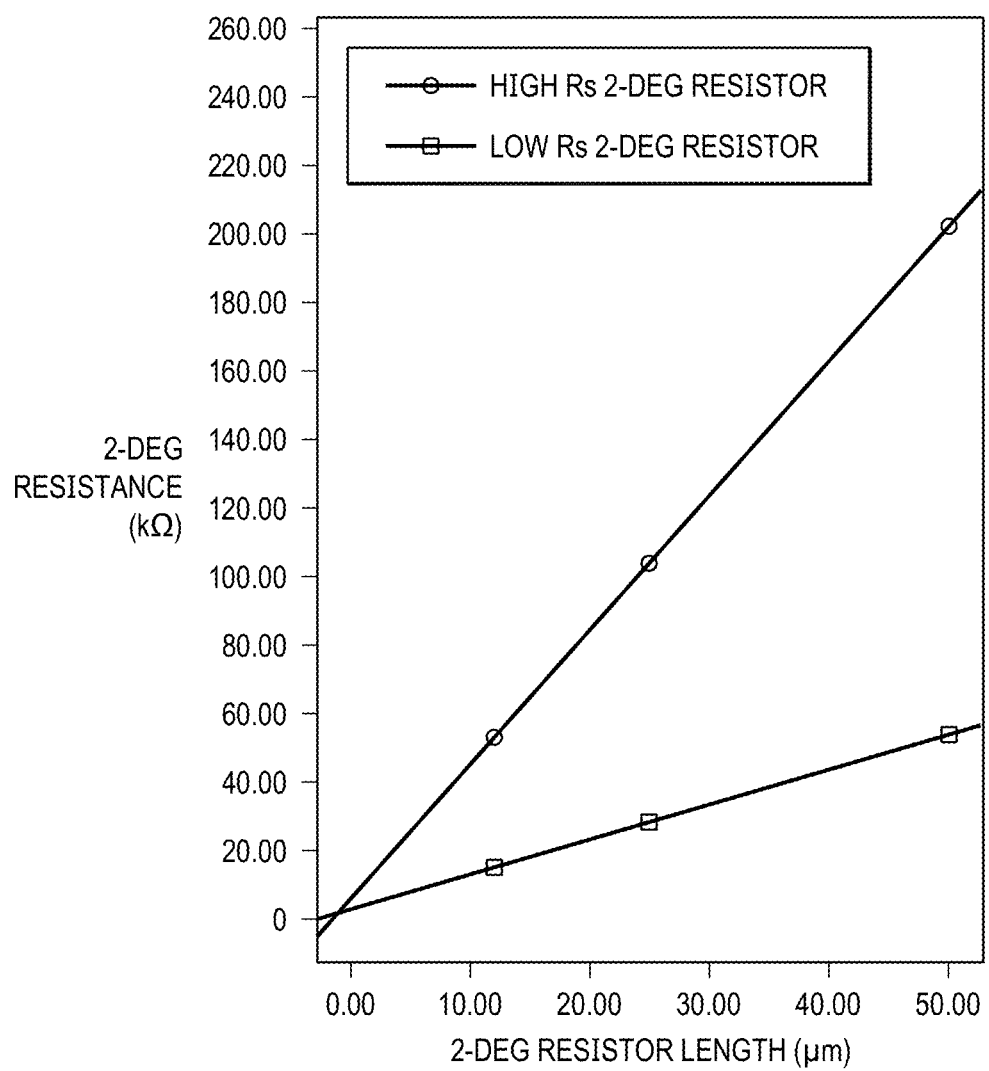
FIG. 4 shows a plot of actual 2-DEG resistance data in kΩ versus resistor length in micrometers for both a low Rs 2-DEG resistor and a high Rs 2-DEG resistor.

FIG. 4 shows a plot of 2-DEG resistance in (kΩ) versus resistor length in micrometers for both a disclosed low Rs 2-DEG resistor that lacks a top layer comprising p-type GaN, and a baseline high Rs 2-DEG resistor that includes a top group III-N layer comprising p-type GaN. Underneath the top layer comprising p-type GaN, was an epitaxial group III-N layer 208 of AlGaN, which was on a group III-N layer 207 comprising GaN.

In FIG. 4 there is shown about a 4×Rs difference between low Rs and high Rs 2-DEG resistors. However, as noted above, this resistance ratio can be changed depending on the HEMT design, such as by changing the thickness of the topside group III-V layer 209 that is included with the high Rs 2-DEG resistor. The nominal difference in Rs for the high and low Rs 2-DEG resistors is generally at least 20%, and more typically the high Rs 2-DEG has an Rs that is about 1 to 8 times the Rs of the low Rs 2-DEG resistor.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. An integrated circuit (IC), comprising:
a lower group III-N layer having a first composition over a substrate;
an upper group III-N layer having a different second composition over the lower group III-N layer;
a gate electrode of a High Electron Mobility Transistor (HEMT) over the upper group III-N layer;
first and second contacts to the lower group III-N layer; and
an unbiased group III-N cover layer on the upper group III-N layer in a resistor area between the first and second contacts, the cover layer having sidewalls in contact with a dielectric layer overlying the resistor area.

2. The IC of claim 1, wherein the unbiased group III-N cover layer comprises p-type GaN, wherein the upper group III-N layer comprises AlGaN, and wherein the lower group III-N layer comprises undoped GaN.

3. The IC of claim 1, wherein the unbiased group III-N cover layer comprises p-type GaN or p-type AlGaN, wherein the upper group III-N layer comprises AlGaN, InAlN or AlN, and wherein the lower group III-N layer comprises undoped GaN.

4. The IC of claim 1, wherein the unbiased group III-N cover layer is a component of a first resistor, and further comprising a second resistor including the lower group III-N layer, a sheet resistance of the first resistor being greater than a sheet resistance of the second resistor by a factor between 1.1 and 1,000.

5. The IC of claim 1, wherein the HEMT and a resistor comprising the resistor area implement a circuit function that comprises power conversion, signal amplification, or signal processing.

6. The IC of claim 1, wherein the unbiased group III-N cover layer is unconnected to any metal.

7. The IC of claim 1, wherein the unbiased group III-N cover layer comprises undoped GaN.

8. The IC of claim 1, wherein the HEMT comprises a depletion mode device.

9. The IC of claim 1, wherein the HEMT comprises an enhancement mode device.

10. An integrated circuit (IC), comprising:
an AlGaN layer on a GaN layer over a substrate; and
a patterned p-type GaN layer on the AlGaN layer, the patterned p-type GaN layer including a gate structure of a High Electron Mobility Transistor (HEMT) and an unbiased cover layer of a resistor,
wherein the IC includes circuitry that includes the HEMT and the resistor and is configured to realize at least one circuit function.

11. The IC of claim 10, wherein the circuit function comprises power conversion, signal amplification, or signal processing.

12. The IC of claim 10, wherein the resistor is a first resistor, and further comprising a second resistor including the GaN layer, a sheet resistance of the first resistor being greater than a sheet resistance of the second resistor by a factor between 1.1 and 1,000.

13. The IC of claim 10, wherein the unbiased cover layer is unconnected to any metal.

14. The IC of claim 10, wherein the HEMT comprises a depletion mode device.

15. The IC of claim 10, wherein the HEMT comprises an enhancement mode device.

16. An integrated circuit (IC), comprising:
a GaN layer over a substrate;
an AlGaN layer on the GaN layer and forming a two-dimensional electron gas (2DEG); and
a first resistor including a first resistive current path through the 2DEG between a set of first resistor electrodes;
a second resistor including a second resistive current path through the 2DEG between a set of second resistor electrodes;
a patterned p-type GaN layer on the AlGaN layer and including a cover layer between the first resistor electrodes, the cover layer partially depleting the 2DEG in the first resistive current path such that the first resistive current path has a higher sheet resistance than the second resistive current path.

17. The IC of claim 16, wherein the cover layer has sidewalls between the first resistor electrodes.

18. The IC of claim 16, further comprising a High Electron Mobility Transistor (HEMT) including a gate structure formed from a same p-type GaN layer as the cover layer and configured to cooperate with the first resistor to implement a circuit function.

19. The IC of claim 16, wherein sheet resistance of the first resistor is greater than the sheet resistance of the second resistor by a factor between 1.1 and 1,000.

* * * * *